(12) United States Patent
Naito

(10) Patent No.: US 10,332,990 B2
(45) Date of Patent: Jun. 25, 2019

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/194,566

(22) Filed: Jun. 28, 2016

(65) Prior Publication Data

US 2017/0018636 A1   Jan. 19, 2017

(30) Foreign Application Priority Data

Jul. 15, 2015 (JP) ................................. 2015-141012
Feb. 12, 2016 (JP) ................................. 2016-024546

(51) Int. Cl.
| | |
|---|---|
| *H01L 29/06* | (2006.01) |
| *H01L 29/08* | (2006.01) |
| *H01L 29/739* | (2006.01) |
| *H01L 29/40* | (2006.01) |
| *H01L 29/66* | (2006.01) |
| *H01L 29/10* | (2006.01) |

(52) U.S. Cl.
CPC ...... *H01L 29/7397* (2013.01); *H01L 29/0649* (2013.01); *H01L 29/0696* (2013.01); *H01L 29/0619* (2013.01); *H01L 29/0623* (2013.01); *H01L 29/0834* (2013.01); *H01L 29/1095* (2013.01); *H01L 29/402* (2013.01); *H01L 29/407* (2013.01); *H01L 29/66348* (2013.01)

(58) Field of Classification Search
CPC ............. H01L 29/7397; H01L 29/0649; H01L 29/0696; H01L 29/0619; H01L 29/407; H01L 29/66348
USPC ........................................................ 257/139
See application file for complete search history.

(56) References Cited

U.S. PATENT DOCUMENTS

2002/0179976 A1  12/2002  Takahashi
2008/0315249 A1*  12/2008  Minato ................. H01L 29/407
                                                                        257/139

(Continued)

FOREIGN PATENT DOCUMENTS

JP    2001-168333 A    6/2001
JP    2010-238721 A    10/2010

*Primary Examiner* — Frederick B Hargrove
*Assistant Examiner* — Patricia D Reddington

(57) ABSTRACT

A semiconductor device is provided comprising a semiconductor substrate of a first conductivity type and a dummy trench portion having a main body portion and one or more branch portions, the main body portion formed in a front surface of the semiconductor substrate and extending in a predetermined extending direction, the branch portions extending from the main body portion in directions different from the extending direction. The semiconductor substrate has an emitter region of first conductivity type and a base region of a second conductivity type which are provided sequentially from the front surface side of the semiconductor substrate, and the dummy trench portion has a dummy trench which penetrates the emitter region and the base region from the front surface of the semiconductor substrate, and a dummy insulating portion which is provided within the dummy trench.

19 Claims, 14 Drawing Sheets

(56) References Cited

U.S. PATENT DOCUMENTS

| | | | |
|---|---|---|---|
| 2012/0313164 A1* | 12/2012 | Senoo | H01L 29/1095 257/330 |
| 2013/0037853 A1* | 2/2013 | Onozawa | H01L 29/0661 257/139 |
| 2013/0075784 A1* | 3/2013 | Ikeda | H01L 27/0727 257/140 |
| 2013/0200451 A1* | 8/2013 | Yilmaz | H01L 29/4236 257/331 |
| 2015/0325687 A1* | 11/2015 | Baburske | H01L 29/0696 257/139 |

* cited by examiner ns are incorporated herein by reference:
SEMICONDUCTOR DEVICE The contents of the following Japanese patent applications are incorporated herein by reference:
NO. 2015-141012 filed on Jul. 15, 2015, and
NO. 2016-024546 filed on Feb. 12, 2016.

BACKGROUND

1. Technical Field

The present invention relates to a semiconductor device.

2. Related Art

Conventionally, in semiconductor elements, a configuration of forming trench gates on a substrate front surface has been known (for example, refer to Patent Document 1). Also, a configuration where some of trench gates are connected with an emitter potential and the like to be a dummy gate has been known. By providing the dummy gate, a carrier Injection Enhanced effect (IE effect) is generated.

PRIOR ART DOCUMENT

Patent Document

Patent Document 1: Japanese Patent Application Publication No. 2002-353456

SUMMARY

From a viewpoint of lowering ON voltage of the semiconductor element, it is preferable to further heighten the IE effect.

According to one aspect of the present invention, provided is a semiconductor device comprising a semiconductor substrate of a first conductivity type and a dummy trench portion having a main body portion and one or more branch portions, the main body portion formed in a front surface of the semiconductor substrate and extending in a predetermined extending direction, the branch portions extending from the main body portion in directions different from the extending direction. The semiconductor substrate has a emitter region of a first conductivity type and a base region of a second conductivity type which are provided sequentially from the front surface side of the semiconductor substrate, and the dummy trench portion has a dummy trench which penetrates the emitter region and the base region from the front surface of the semiconductor substrate, and a dummy insulating portion which is provided within the dummy trench.

The above-described summary clause of the invention does not necessarily describe all necessary features of the embodiments of the present invention. Also, the present invention may also be a sub-combination of the features described above.

DESCRIPTION OF EXEMPLARY EMBODIMENTS

Hereinafter, some embodiments of the present invention will be described. The following embodiments do not limit the invention according to the claims, and all the combinations of the features described in the embodiments are not necessarily essential to means provided by aspects of the invention.

Figure 1:
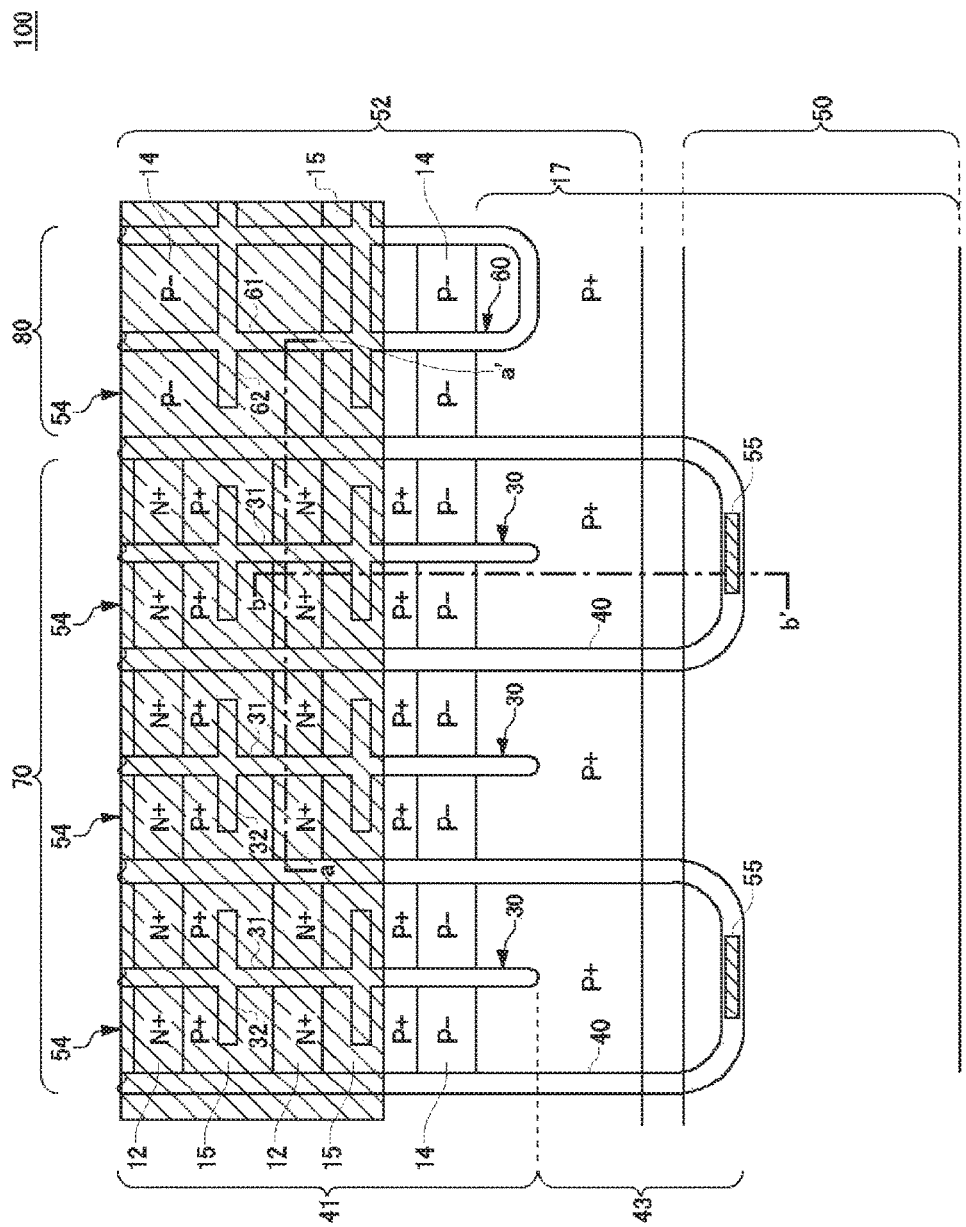
FIG. 1 is a plan view showing one example of a semiconductor device 100.

FIG. 1 is a plan view showing one example of a semiconductor device 100. The semiconductor device 100 of the present example is a semiconductor chip comprising a transistor unit 70 that includes a transistor such as an IGBT (Insulated Gate Bipolar Transistor), and a diode unit 80 that includes a diode such as an FWD (Free Wheel Diode). In FIG. 1, a chip front surface near an end portion of the chip is shown and other regions are omitted.

Also, although in FIG. 1 an active region of a semiconductor substrate in the semiconductor device 100 is shown, the semiconductor device 100 may comprise a pressure resistant structure portion surrounding the active region. The active region refers to a region where a current flows when the semiconductor device 100 is controlled to be in an ON state. The pressure resistant structure portion mitigates electric field concentration on the front surface side of the semiconductor substrate. The pressure resistant structure portion has, for example, a guard ring structure, a field plate structure, a resurf structure or a combination structure thereof.

The semiconductor device 100 of the present example comprises a gate electrode 50, an emitter electrode 52, a gate trench portion 40, a dummy trench portion 30, an emitter trench portion 60, well region 17, an emitter region 12, a base region 14, a contact region 15, a contact hole 54 and a contact hole 55 on the front surface side of the chip. The emitter electrode 52 is one example of a first front surface side electrode, and the gate electrode 50 is one example of a second front surface side electrode.

The gate trench portion 40, the dummy trench portion 30, the emitter trench portion 60, the well region 17, the emitter region 12, the base region 14 and the contact region 15 are formed inside the front surface side of the semiconductor substrate, and the emitter electrode 52 and the gate electrode 50 are provided above the front surface of the semiconductor substrate.

Although an interlayer insulating film is formed between the emitter electrode 52 and the front surface of the semiconductor substrate, and between the gate electrode 50 and the front surface of the semiconductor substrate, it is omitted in FIG. 1. The contact holes 54 and the contact holes 55 are formed to penetrate the interlayer insulating film. The emitter electrode 52 is in contact with the semiconductor substrate through the contact hole 54. The gate electrode 50 is in contact with the semiconductor substrate through the contact hole 55.

The emitter electrode 52 and the gate electrode 50 are formed with materials including metal. For example, at least a partial region of each electrode is formed with aluminum. Each electrode may have a region formed with materials including tungsten.

One or more gate trench portions 40 and one or more dummy trench portions 30 are arrayed at predetermined intervals along predetermined array directions in the region of the transistor unit 70. The dummy trench portion 30 is not electrically connected with the gate electrode 50. By providing the dummy trench portion 30 that is not connected with the gate electrode 50, the IE effect can be produced.

The gate trench portion 40 is connected with the gate electrode 50 through the contact hole 55. The gate trench portion 40 controls whether or not to form a current channel in a base region formed on a back surface side of the emitter region 12 within the semiconductor substrate.

The gate trench portion 40 has a facing portion 41 and a protruding portion 43. The facing portion 41 is formed extending in a predetermined extending direction in a range facing the dummy trench portion 30. The protruding portion 43 further extends from the facing portion 41 and is formed in a range without facing the dummy trench portion 30. In the present example, two facing portions 41 provided on two sides of the dummy trench portion 30 are connected with each other by one protruding portion 43. At least a part of the protruding portion 43 may have a curved shape.

In an insulation layer that covers the protruding portion 43, the contact hole 55 is formed. The contact hole 55 may be formed corresponding to a region in the protruding portion 43 farthest from the facing portion 41. The protruding portion 43 of the present example has a portion extending in a direction orthogonal to the facing portion 41 in the region farthest from the facing portion 41. The contact hole 55 may be formed corresponding to the portion of the protruding portion 43.

The dummy trench portion 30 has main body portions 31 formed extending in the predetermined extending direction in the front surface of the semiconductor substrate, and branch portions 32 extending from the main body portion 31 in directions different from the extending direction of the main body portion 31. The main body portion 31 in the present example has a linear shape and is formed to extend in a direction vertical to the above-described array direction of the trench portion. A plurality of the branch portions 32 may be provided in parallel with each other. The main body portion 31 of the present example is provided to face the facing portion 41 of the gate trench portion 40, and extends in the same extending direction as the facing portion 41 of the gate trench portion 40. Also, one or more main body portions 31 are provided between two facing portions 41.

One or more branch portions 32 are provided respectively to one main body portion 31. The branch portions 32 in the present example have a linear shape, and extend in directions orthogonal to the extending direction of the main body portion 31. The branch portions 32 extend in a direction toward the facing portion 41 of the gate trench portion 40 from the main body portion 31. The branch portions 32 are provided on two sides of the main body portion 31. From the same portion in the extending direction of the main body portion 31 in the present example, two branch portions 32 are provided on two sides of the main body portion 31. In another example, the branch portion 32 on one side of the main body portion 31 may be provided in a portion different from where the branch portion 32 on the other side of the main body portion 31 is provided in the extending direction of the main body portion 31. The branch portion 32 on one side of the main body portion 31 and the branch portion 32 on the other side of the main body portion 31 may be provided alternately in the extending direction of the main body portion 31.

The branch portions 32 in the present example are provided inside the contact region 15 in the front surface of the semiconductor substrate. In the front surface of the semiconductor substrate, the entire branch portions 32 may be provided not to project from the contact region 15. At least some of the branch portions 32 may not be in contact with the gate trench portion 40. Also, at least of some of the branch portions 32 may be in contact with the gate trench portion 40. In the front surface of the semiconductor substrate, when the branch portions 32 are provided in the emitter region 12, it is preferable that the branch portions 32 are not in contact with the gate trench portion 40. Thereby, a region to function as a channel can be left between the branch portions 32 and the gate trench portion 40.

In this way, since the dummy trench portion 30 has the branch portions 32, the area occupied by the dummy trench portion 30 in the front surface of the semiconductor substrate can be increased. Accordingly, the IE effect can be enhanced. Also, since the branch portions 32 branch from the main body portion 31, it is possible to make the dummy trench portion 30 in a complicated shape. Accordingly, compared to a case where a linear dummy trench portion with the same area is provided, the IE effect can be further heightened. For example, the passage of holes can be efficiently suppressed in a region in contact with the dummy trench portion 30. By providing the branch portions 32, a total length of end sides of the dummy trench portion 30 in the front surface of the semiconductor substrate can be increased and the passage of holes can be efficiently suppressed. Also, in the dummy trench portion 30 in the present example, a plurality of corners where two sides are surrounded by the branch portion 32 and the main body portion 31 are formed in portions where the respective branch portion 32 and the respective main body portion 31 are connected with each other. Such a corner-shaped region can efficiently suppress the passage of holes. For this reason, the dummy trench portion 30 of the present example can efficiently heighten the IE effect.

Each branch portion 32 may have the same width. The width of the branch portion 32 indicates a length of the branch portion 32 in a direction vertical to the extending direction of the branch portion 32. In another example, the branch portions 32 may have different widths in the extending direction. For example, the width of the branch portions 32 may be decreased in a step shape in accordance with an increase in the distance from the main body portion 31. Since the branch portions 32 have the step shape, the length of the end sides of the above-described dummy trench portion 30 and the number of the corners can be increased.

The emitter trench portion 60 is provided in the diode unit 80 region. The emitter trench portion 60 may have a similar shape to the shape of the gate trench portion 40 in the front surface of the semiconductor substrate. However, the length of the emitter trench portion 60 in its extending direction may be shorter than that of the gate trench portion 40. The length of the emitter trench portion 60 in the present example is the same as that of the dummy trench portion 30.

Also, the emitter trench portion 60 has a main body portion 61 and branch portions 62. In the front surface of the semiconductor substrate, the shape of the main body portion 61 may be similar to that of the gate trench portion 40. That is, the main body portion 61 may have a plurality of linear extension portions and a connection portion which connects two adjacent extension portions. The connection portion may have curved portions, similar to the protruding portion 43.

The branch portions 62 may have similar arrangements and shapes to those of the branch portions 32. One or more branch portions 62 are provided for one main body portion 61. The branch portions 62 in the present example have a linear shape and extend in directions orthogonal to the extending direction of the main body portion 61. The branch portions 62 may connect two extension portions in the main body portion 61. The branch portions 62 in the present example do not connect with the gate trench portion 40.

The gate electrode 50 is formed covering some of the protruding portion 43. The gate electrode 50 is formed covering a portion in the protruding portion 43 where the contact hole 55 is provided. The gate electrode 50 in the present example is not formed above the facing portion 41, the dummy trench portion 30 and the emitter trench portion 60.

The emitter electrode 52 is formed above the gate trench portion 40, the dummy trench portion 30, the emitter trench portion 60, the well region 17, the emitter region 12, the base region 14 and the contact region 15. The emitter electrode 52 in the present example is formed covering a part of the well region 17 and the gate trench portion 40.

The well region 17 is formed in a predetermined range from an end portion of the semiconductor substrate on a side where the gate electrode 50 is provided. A partial region in the gate electrode 50 side of the dummy trench portion 30, the emitter trench portion 60 and the facing portion 41 is formed in the well region 17. The entire protruding portion 43 may be formed in the well region 17. The semiconductor substrate has a first conductivity type and the well region 17 has a second conductivity type different from the semiconductor substrate. The semiconductor substrate in the present example is an N−-type, and the well region 17 is a P+-type. In the present example, the first conductivity type is described as an N-type and the second conductivity type is described as a P-type. However, the first and the second conductivity types may be opposite conductivity types.

The base region 14 is formed in at least some of regions sandwiched by the facing portion 41 of the gate trench portion 40, the main body portion 31 of the dummy trench portion 30 and the extension portions of the emitter trench portion 60. The base region 14 is of a second conductivity type with an impurity concentration lower than that of the well region 17. The base region 14 in the present example is a P−-type.

In a front surface of the base region 14, a contact region 15 of the second conductivity type with an impurity concentration higher than that of the base region 14 is formed. The contact region 15 of the present example is P+-type. Also, in the transistor unit 70, an emitter region 12 of the first conductivity type with an impurity concentration higher than that of the semiconductor substrate is selectively formed in a partial front surface of the contact region 15. The emitter region 12 in the present example is N+-type.

The contact region 15 and the emitter region 12 are formed respectively from one trench portion to the other adjacent trench portion among the facing portions 41 of the gate trench portions 40, the main body portions 31 of the dummy trench portions 30 and the extension portions of the emitter trench portions 60. One or more contact regions 15 and one or more emitter regions 12 of the transistor unit 70 are formed so as to be exposed alternately in regions sandwiched by respective trench portions along the extending direction of the trench portion.

In the transistor unit 70, the contact hole 54 is formed above each region of the contact region 15, the emitter region 12 and the dummy trench portion 30. In order to maximize the contact area between the emitter region 12 and the emitter electrode 52, the contact hole 54 is formed from one trench portion to the other adjacent trench portion. Also, the contact hole 54 may be formed such that the entire range of the front surface of the emitter region 12 is exposed. Also, the contact hole 54 may be formed such that the entire range of the front surface of the contact region 15 is exposed. However, the contact hole 54 is not formed in regions which correspond to the base region 14 and the well region 17.

Also, the contact hole 54 may not be formed or may be formed above the gate trench portion 40. However, in a case where the contact hole 54 is formed above the gate trench portion 40, an insulating portion which insulates an electrode in the trench from the emitter electrode 52 may be formed at an upper end in the trench of the gate trench portion 40.

The contact hole 54 exposes the main body portion 31 of the dummy trench portion 30 in the range facing the emitter region 12 and the contact region 15. Also, the contact hole 54 also exposes the branch portions 32 extending from the main body portion 31. As being described below, the emitter region 12 may be exposed on an inner wall of the trench in the dummy trench portion 30. The emitter electrode 52 may be formed through the contact hole 54 to the inside of the trench of the dummy trench portion 30.

Accordingly, the emitter electrode 52 can be in contact with not only the front surface of the emitter region 12 exposed on the front surface of the semiconductor substrate but also a side surface of the emitter region 12 exposed on the inner wall of the trench of the dummy trench portion 30; thereby, the contact resistance to the emitter region 12 can be lowered. For this reason, the ON voltage of the semiconductor device 100 can be lowered.

Also, in the diode unit 80, the contact hole 54 is formed above each region of the contact region 15, the base region 14 and the emitter trench portion 60. The contact hole 54 in the present example is not formed for the base region 14 which is closest to the gate electrode 50 among a plurality of the base regions 14. In the present example, the contact hole 54 of the transistor unit 70 and the contact hole 54 of the diode unit 80 have the same length in the extending direction of each trench portion.

In the diode unit 80, in order to maximize the contact areas between the contact region 15 and the emitter electrode 52, and between the base region 14 and the emitter electrode 52, the contact hole 54 is formed from one extension portion of the diode unit 80 to the other adjacent extension portion. However, the contact hole 54 is not formed in regions which correspond to the base region 14 and the well region 17.

Also, the contact hole 54 is formed so as to expose the emitter trench portion 60. Similar to the dummy trench portion 30, the base region 14 may be exposed on the inner wall of the trench of the emitter trench portion 60. The emitter electrode 52 is formed through the contact hole 54 to the inside the trench of the emitter trench portion 60.

Accordingly, the emitter electrode 52 can be in contact with not only the front surface of the base region 14 exposed on the front surface of the semiconductor substrate but also the side surface of the base region 14 exposed on the inner wall of the trench of the emitter trench portion 60. Therefore, the contact resistance to the base region 14 can be lowered.

Figure 2:
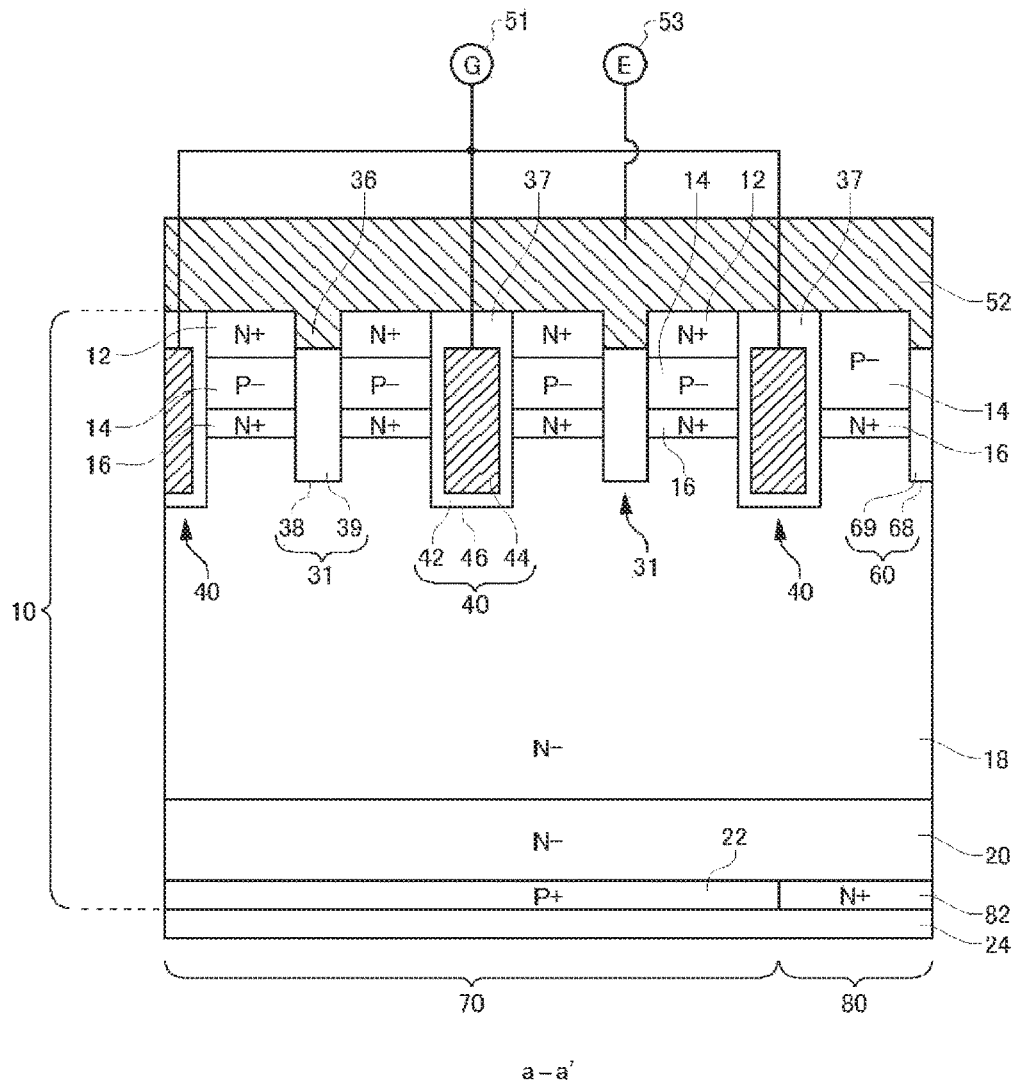
FIG. 2 is a drawing showing one example of an a-a' section in FIG. 1.

FIG. 2 is a drawing showing one example of an a-a' section in FIG. 1. The semiconductor device 100 in the present example comprises a semiconductor substrate 10, an emitter electrode 52 and a collector electrode 24 in the section. The emitter electrode 52 is formed on the front surface of the semiconductor substrate 10. The emitter electrode 52 is electrically connected with the emitter terminal 53.

The collector electrode 24 is formed on the back surface of the semiconductor substrate 10. The collector electrode 24 is electrically connected with collector terminals. The emitter electrode 52 and the collector electrode 24 are formed with conductive materials such as metals. Also, in the present specification, a face on the emitter electrode 52 side of each member such as a substrate, a layer and a region is referred to as a front surface, and a face on the collector electrode 24 side is referred to as a back surface or a bottom portion. Also, a direction connecting the emitter electrode 52 and the collector electrode 24 is referred to as a depth direction.

The semiconductor substrate 10 may be a silicon substrate, and may also be a silicon carbide substrate, a nitride semiconductor substrate and the like. On the front surface side of the semiconductor substrate 10, a $P^-$-type base region 14 is formed. Also, the $N^+$-type emitter region 12 is selectively formed in a partial region on the front surface side of the base region 14.

Also, the semiconductor substrate 10 further has an $N^+$-type accumulation region 16, an $N^-$-type drift region 18, an $N^-$-type buffer region 20, a $P^+$-type collector region 22 and an $N^+$-type cathode region 82. The accumulation region 16 is formed on the back surface side of the base region 14. An impurity concentration of the accumulation region 16 is higher than an impurity concentration of the drift region 18.

The accumulation region 16 is formed between adjacent trenches. For example, in the transistor unit 70, the accumulation region 16 is formed between the main body portion 31 of the dummy trench portion 30 and the gate trench portion 40. The accumulation region 16 may be provided so as to cover the entire region between the main body portion 31 and the gate trench portion 40. By providing the accumulation region 16, the IE effect can be heightened and the ON voltage can be lowered.

The drift region 18 is formed on the back surface side of the accumulation region 16. The buffer region 20 is formed on the back surface side of the drift region 18. An impurity concentration of the buffer region 20 is higher than an impurity concentration of the drift region 18. The buffer region 20 may function as a field stop layer which prevents a depletion layer from reaching the collector region 22 and the cathode region 82, the depletion layer extending from the back surface side of the base region 14.

The collector region 22 is formed on the back surface side of the buffer region 20 in the region of the transistor unit 70. The cathode region 82 is formed on the back surface side of the buffer region 20 in the region of the diode unit 80. Also, the collector electrode 24 is provided in the back surfaces of the collector region 22 and the cathode region 82.

On the front surface side of the semiconductor substrate 10, one or more gate trench portions 40, one or more dummy trench portions 30 (the main body portions 31 are shown in FIG. 2) and one or more emitter trench portions 60 are formed. Each trench portion penetrates the base region 14 from the front surface of the semiconductor substrate 10 and reaches the drift region 18. In the present example, the gate trench portion 40 and the dummy trench portion 30 penetrate the emitter region 12, the base region 14 and the accumulation region 16 from the front surface of the semiconductor substrate 10, and reach the drift region 18. Also, the emitter trench portion 60 penetrates the base region 14 and the accumulation region 16 from the front surface of the semiconductor substrate 10 and reaches the drift region 18.

The gate trench portion 40 has a gate trench 46, an insulation film 42, a gate conductive portion 44 and a gate insulating portion 37 which are formed on the front surface side of the semiconductor substrate 10. The gate trench 46 is formed from the front surface of the semiconductor substrate 10, penetrating the emitter region 12, the base region 14 and the accumulation region 16 and reaching the drift region 18.

The insulation film 42 is formed covering an inner wall of the gate trench 46. The insulation film 42 may be formed by oxidizing or nitriding the semiconductor in the inner wall of the gate trench 46. The gate conductive portion 44 is formed on the inner side of the insulation film 42 inside the gate trench 46. That is, the insulation film 42 insulates the gate conductive portion 44 from the semiconductor substrate 10. The gate conductive portion 44 is formed with conductive materials such as polysilicon.

The gate insulating portion 37 is formed above the gate conductive portion 44. The gate insulating portion 37 insulates the gate conductive portion 44 from the emitter electrode 52. The gate insulating portion 37 in the present example is formed inside the gate trench 46. The gate insulating portion 37 includes, for example, silicon oxide, silicon nitride or other insulating materials. A thickness in the depth direction of the gate insulating portion 37 may be greater than a thickness of the insulation film 42 in a bottom portion of the gate trench 46.

In the present example, at least a part of an end surface in semiconductor substrate 10 side of the gate insulating portion 37 has the same height as that of the front surface of the semiconductor substrate 10. As one example, the entire end surface of the gate insulating portion 37 may be formed in the same plane as the front surface of the semiconductor substrate 10. Accordingly, unevenness in the front surface of the semiconductor substrate 10 can be decreased and a structure laminating above the front surface of the semiconductor substrate 10 can be easily formed.

The gate conductive portion 44 includes at least a region facing the adjacent base region 14. The respective gate conductive portions 44 are electrically connected with the gate terminals 51. In the present example, as shown in FIG. 1, the gate conductive portion 44 electrically connects with the gate electrode 50 in the protruding portion 43. Also, the gate electrode 50 electrically connects with the gate terminal 51. When a predetermined voltage is applied to the gate conductive portion 44 through the gate terminal 51, a channel is formed in a surface layer of an interface in contact with the gate trench 46 among the base region 14.

The dummy trench portion 30 (the main body portions 31 in example of FIG. 2) has a dummy trench 38 and a dummy insulating portion 39 formed on the front surface side of the semiconductor substrate 10. FIG. 2 shows a structure of the main body portion 31. The branch portion 32 may have a structure similar to that of the main body portion 31. The dummy trench 38 is formed to penetrate the emitter region 12 from the front surface of the semiconductor substrate 10, the base region 14 and the accumulation region 16.

The dummy insulating portion 39 is provided inside the dummy trench 38. As shown in FIG. 2, the dummy insulating portion 39 is filled from the bottom portion of the dummy trench 38 to a predetermined height within the dummy trench 38. In this case, no conductive material such as polysilicon is provided inside the dummy trench 38. For this reason, the conductive materials in the dummy trench 38 will not be conducted with the base region 14 of the semiconductor substrate 10 and the like, either. For this reason, the reliability of the semiconductor device 100 can be improved.

The width of the dummy trench 38 may be shorter than the width of the gate trench 46. Accordingly, in a process of forming the insulation film 42 in the gate trench 46, the dummy insulating portion 39 can be filled within the dummy trench 38. The insulation film 42 may be formed by a process different from that for the dummy insulating portion 39. Also, the width of the dummy trench 38 may be the same as the width of the gate trench 46.

The dummy trench 38 may be formed shallower than the gate trench 46. In this case, the dummy trench 38 with a small width and the gate trench 46 with a large width can be formed by the same etching process. The dummy trench 38 and the gate trench 46 may be formed by different etching processes. Also, the dummy trench 38 may be formed to the same depth as that of the gate trench 46.

The dummy insulating portion 39 may be filled in the entire dummy trench 38, and may also be filled in a portion of the dummy trench 38. The dummy insulating portion 39 may be filled within the dummy trench 38 such that at least a part of the emitter region 12 is exposed on the side wall of the dummy trench 38. The depth of the upper end of the dummy insulating portion 39 may be lower than the depth of the upper end of the emitter region 12 and higher than the depth of the lower end of the emitter region 12.

As described above, the emitter electrode 52 is formed above the front surface of the semiconductor substrate 10 and is in contact with the front surface of the emitter region 12. The emitter electrode 52 in the present example is also formed in a region where the dummy insulating portion 39 in the dummy trench 38 is not provided. Accordingly, the emitter electrode 52 can be also in contact with the emitter region 12 on the side wall of the dummy trench 38 while being in contact with the front surface of the emitter region 12. Accordingly, the contact resistance between the emitter electrode 52 and the emitter region 12 can be lowered.

The structure of the dummy trench portion 30 is not limited to the example of FIG. 2. Similar to the gate trench portion 40, the dummy trench portion 30 may have an insulation film covering the inner wall of the dummy trench 38 and conductive materials such as polysilicon surrounded by the insulation film. In this case, although the reliability of the insulation film has to be ensured, since the dummy trench portion 30 and the gate trench portion 40 have the similar structures to each other, the dummy trench portion 30 and a portion of the gate trench portion 40 can be formed by the same process.

The emitter electrode 52 may have the plug portion 36 arranged within the dummy trench 38. The plug portion 36 is in contact with the emitter region 12 exposed on the side wall of the dummy trench 38. The plug portion 36 may be formed with the same material as the material with which the region of the emitter electrode 52 is formed above the front surface of the semiconductor substrate 10, and may be formed with a material different from that.

As one example, the plug portion 36 is formed with a material including tungsten, and the emitter electrode 52 excluding the plug portion 36 is formed with a material not including tungsten. By forming the plug portion 36 with the material including tungsten, the plug portion 36 can also be easily formed inside the fine dummy trench.

In the present example, the gate trench portion 40 and the main body portion 31 of the dummy trench portion 30 are arranged alternately in a predetermined array direction as shown in FIG. 2. Also, each trench portion may be arranged at a fixed interval. However, the arrangement for each trench is not limited to the example described above. A plurality of gate trench portions 40 may be arranged between two main body portions 31. Also, the numbers of the gate trench portions 40 provided between the respective main body portions 31 may be not fixed.

The diode unit 80 is provided in a region adjacent to the transistor unit 70. The diode unit 80 has the base region 14, the accumulation region 16, the drift region 18 and the buffer region 20 in the same layer as the transistor unit 70. On the back surface side of the buffer region 20 of the diode unit 80, the cathode region 82 is provided. Also, the diode unit 80 has one or more emitter trench portions 60. Also, in the diode unit 80, the emitter region 12 is not formed.

The emitter trench portion 60 is formed from the front surface side of the base region 14, penetrating the base region 14 and the accumulation region 16 and reaching the drift region 18. Similar to the dummy trench portion 30, each emitter trench portion 60 has an emitter trench 68 and an emitter insulating portion 69. The emitter trench portion 60 may have the same structure as that of the main body portion 31 of the dummy trench portion 30.

On the side wall of the emitter trench 68, the base region 14 may be exposed. The emitter electrode 52 may have a plug portion arranged inside the emitter trench 68. The plug portion is in contact with the base region 14 exposed on the side wall of the emitter trench 68. According to such a configuration, the contact resistance between the emitter electrode 52 and the base region 14 can be decreased.

Also, in the present example, the respective interval between the trench portions in the transistor unit 70 in the section is the same as the respective interval between the emitter trench portions 60 in the diode unit 80. As shown in FIG. 2, in a case where the gate trench portion 40 and the main body portion 31 are arranged alternately in the transistor unit 70, the respective interval between the gate trench portion 40 and the main body portion 31 may be the same as the respective interval between the emitter trench portions 60. Also, the length of the plug portion arranged in the emitter trench 68 may be the same as the length of the plug portion 36 arranged in the dummy trench 38.

Figure 3:
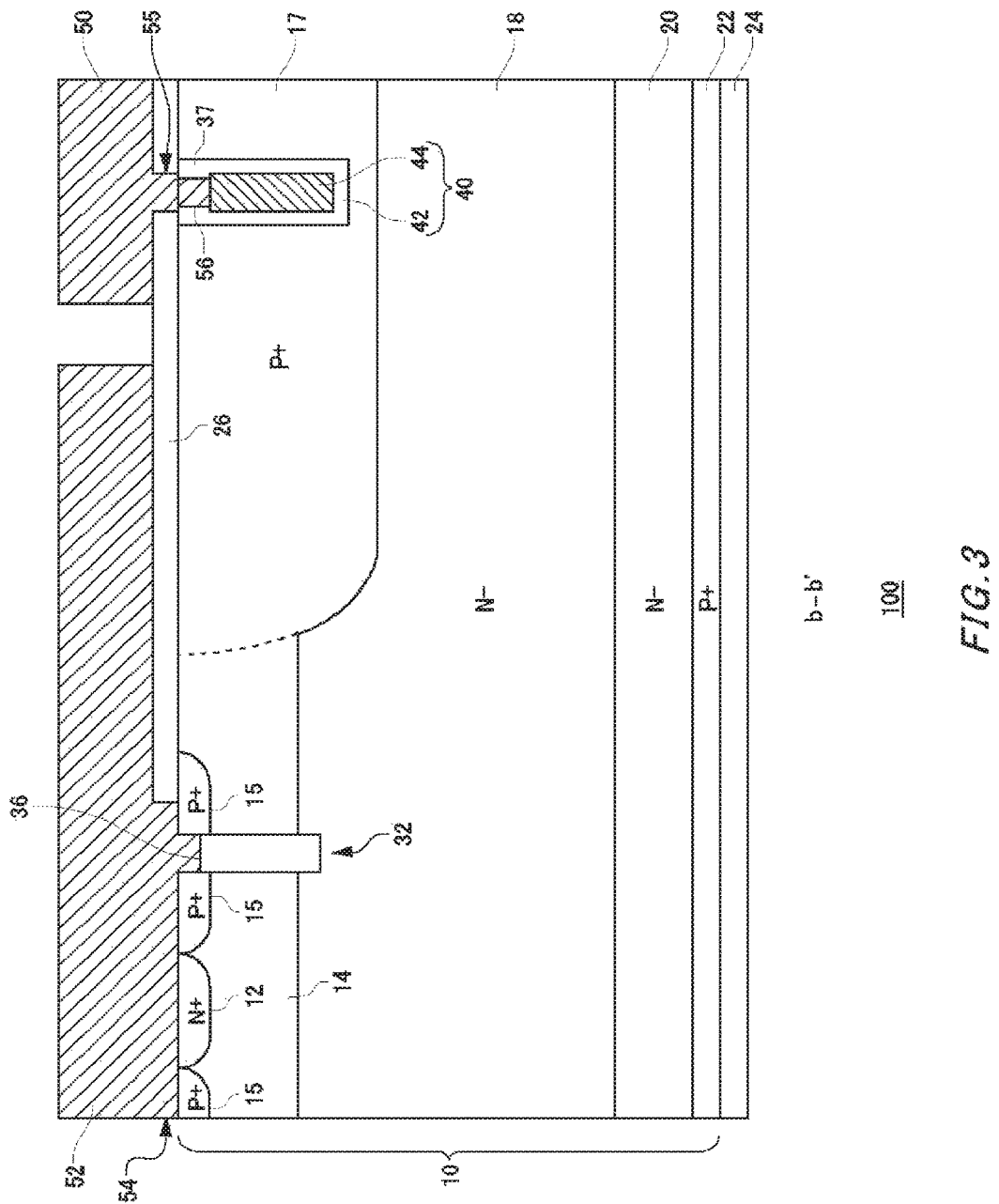
FIG. 3 is a drawing showing one example of a b-b' section in FIG. 1.

FIG. 3 is a drawing showing one example of a b-b' section in FIG. 1. In FIG. 3, the accumulation region 16 is omitted. The semiconductor device 100 in the present example comprises the semiconductor substrate 10, the interlayer insulating film 26, the emitter electrode 52 and the collector electrode 24 in the section. The semiconductor substrate 10 has the branch portions 32 of the dummy trench portion 30 in the section. The structure and the size of the branch portion 32 may be the same as those of the main body portion 31 shown in FIG. 2.

The branch portion 32 in the present example is formed penetrating the contact region 15 and the base region 14. Also, although in the example of FIG. 3 the branch portion 32 is provided in one contact region 15, a plurality of branch portions 32 may be provided in one contact region 15. Also, the branch portion 32 may be provided penetrating the emitter region 12 and the base region 14.

The interlayer insulating film 26 is formed between the gate electrode 50 and the semiconductor substrate 10, and between the emitter electrode 52 and the semiconductor substrate 10. In the interlayer insulating film 26, the contact holes 54 and 55 are formed.

The contact hole 54 allows exposes of at least some of the dummy trench portions 30 (the branch portion 32 in FIG. 3), the emitter regions 12 and the contact regions 15 in the front surface of the semiconductor substrate 10. The emitter electrode 52 penetrates the contact hole 54 and is in contact with the dummy trench portion 30, the emitter region 12 and the contact region 15.

The emitter electrode 52 may be in contact with the contact region 15 within the dummy trench of the branch portion 32. The emitter electrode 52 of the present example has the plug portion 36 arranged within the dummy trench of the branch portion 32. The branch portion 32 and the plug portion 36 to be inserted into the main body portion 31 may be formed integrally.

The contact hole 55 allows exposes of at least a part of the protruding portion 43 of the gate trench portion 40 in the front surface of the semiconductor substrate 10. A through hole is formed in the gate insulating portion 37 of the gate trench portion 40 exposed by the contact hole 55. The gate electrode 50 passes through the contact hole 55 and the through hole of the gate insulating portion 37, and is in contact with the gate conductive portion 44. The gate electrode 50 has the plug portion 56 which passes through the through hole of the gate insulating portion 37. The plug portion 56 may be formed with the same material as the plug portion 36 shown in FIG. 2.

Next, one example of a method of manufacturing the semiconductor device 100 shown in FIG. 1 to FIG. 3 will be described. However, the method of manufacturing the semiconductor device 100 is not limited to the present example. First, a semiconductor substrate 10 with the same conductivity type as that of the drift region 18 (in the present example, it is described as N$^-$-type) is prepared.

Next, an etching mask with a predetermined pattern is provided in the front surface of the semiconductor substrate 10, and a plurality of trenches are formed for the gate trench portion 40, the dummy trench portion 30 and the emitter trench portion 60. After the trenches are formed, an insulation film is formed on the inner wall of the gate trench. Also, the insulating portion is filled inside the dummy trench and the emitter trench. The insulation film of the gate trench, the insulating portion of the dummy trench and the insulating portion of the emitter trench may be formed by the same process. After forming the insulation film in the gate trench, conductive materials are filled inside the gate trench.

Next, P-type impurities are implanted from the front surface side of the semiconductor substrate and a heat treatment at a temperature of about 1100° C. is performed for about 2 hours, and then a P-type base region 14 shallower than the trench is formed in the entire front surface of the semiconductor substrate 10. Next, N-type impurities are implanted from the front surface side of the semiconductor substrate 10, and then an N-type accumulation region 16 is formed which is deeper than the base region 14 but shallower than the trench. For example, the N-type accumulation region 16 is formed by an ion implantation of phosphorous of about $5.0 \times 10^{12}/cm^2$ at an acceleration voltage of 2.8 MeV.

Next, using a mask where a portion corresponding to the emitter region 12 is opened, the N-type impurities are selectively implanted from the front surface side of the semiconductor substrate 10. Accordingly, the N$^+$-type emitter region 12 is selectively formed inside the P-type base region 14.

After that, the interlayer insulating film 26 is formed on the front surface side of the semiconductor substrate 10. The interlayer insulating film 26 is also formed above the conductive portion within the gate trench. The interlayer insulating film 26 formed in the gate trench functions as the gate insulating portion 37. Here, a side surface of the emitter region 12 may be exposed within the trench by removing the insulating portion formed in the upper portions of the dummy trench and the emitter trench.

Also, in the protruding portion 43 of the gate trench portion 40, the through hole is formed in the gate insulating portion 37. Also, in the interlayer insulating film 26, the contact hole 54 and the contact hole 55 are formed. Then, the emitter electrode 52 and the gate electrode 50 are formed. Each electrode may be formed in the front surface of the semiconductor substrate 10 after forming the plug portion 36 and the plug portion 56.

Next, after an ion implantation of selenium at, for example, about $1.0 \times 10^{14}/cm^2$ from the back surface side of the semiconductor substrate 10, a heat treatment at a temperature of about 900° C. is performed for about 2 hours. Accordingly, the N$^+$-type buffer region 20 is formed on the back surface side of the semiconductor substrate 10. The remaining N$^-$-type region of the semiconductor substrate 10 becomes the drift region 18. By using selenium which has a large diffusion coefficient, the buffer region 20 can be formed at a deep position. Also, before forming the buffer region 20, the semiconductor substrate 10 may be polished to adjust the thickness.

Instead of the ion implantation of selenium, the N$^+$-type buffer region 20 may be formed by an ion implantation of proton for multiple times of different dosages. Accordingly, it is possible to form the buffer region 20 whose impurity concentration increases from the front surface side of the substrate toward the back surface side of the substrate.

Next, from the back surface side of the semiconductor substrate 10, the ion implantation of P-type impurities is performed with a dosage no less than $1.0 \times 10^{13}/cm^2$ and no greater than $4.0 \times 10^{13}/cm^2$, for example. Accordingly, on the back surface side of the semiconductor substrate 10, the P$^+$-type collector region 22 thinner than the buffer region 20 is formed. Since the collector region and the collector electrode cannot be joined by ohmic junction, it is not preferable to have a dosage of the P-type impurities less than $1.0 \times 10^{13}/cm^2$. Also, in the diode unit 80, the cathode region 82 is formed. Then, the collector electrode 24 and the like are appropriately formed on the back surface side of the semiconductor substrate 10.

Figure 4:
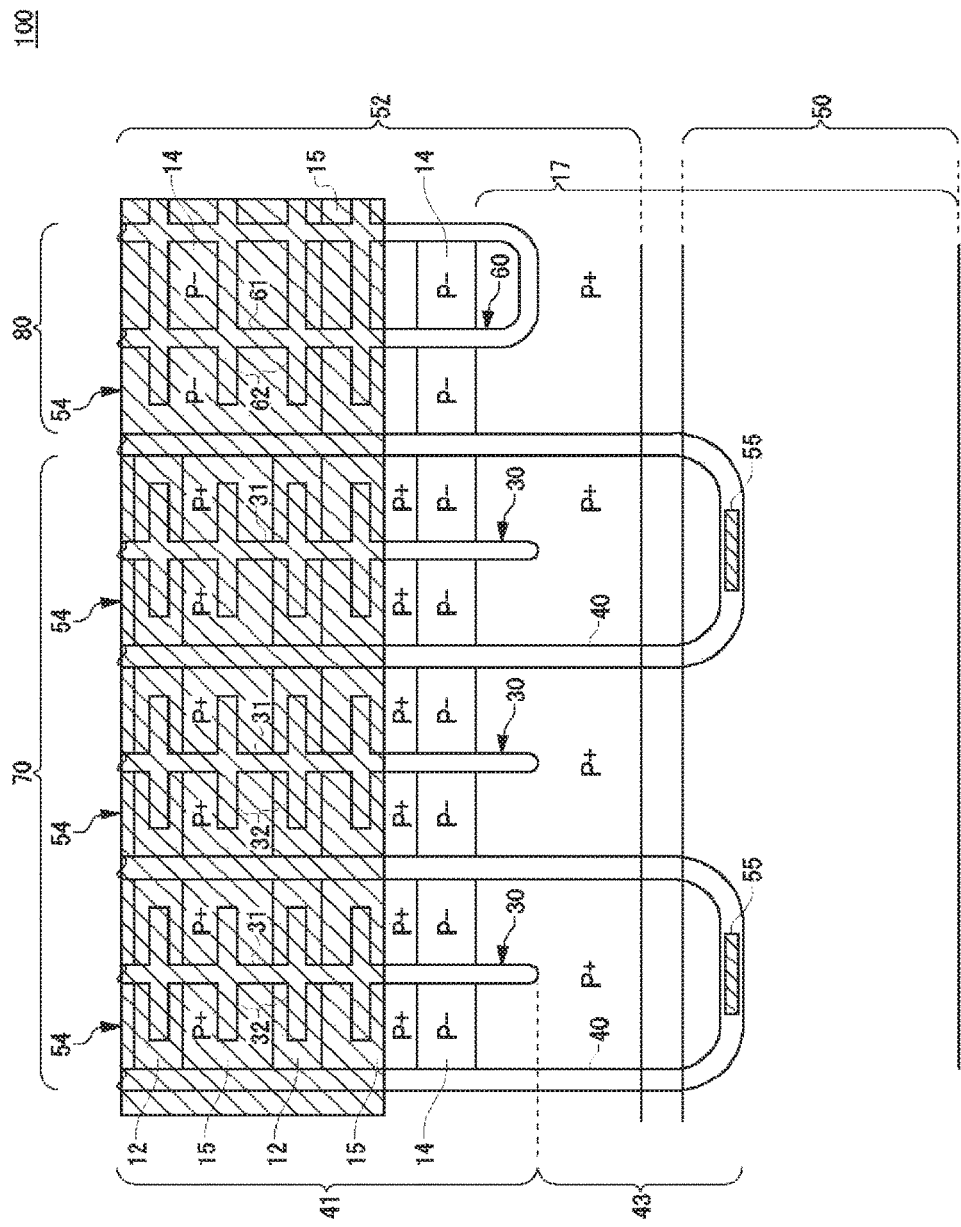
FIG. 4 is a plan view showing another example of the semiconductor device 100.

FIG. 4 is a plan view showing another example of the semiconductor device 100. The semiconductor device 100 of the present example is different from the example of FIG. 1 in a point that the branch portion 32 is also provided inside the emitter region 12 in the front surface of the semiconductor substrate. The other structures may be the same as those in the semiconductor device 100 shown in FIG. 1 to FIG. 3.

The branch portion 32 in the present example is provided in each emitter region 12 and each contact region 15. The branch portion 32 provided in the emitter region 12 and the branch portion 32 provided in the contact region 15 may be provided in parallel with each other. The branch portion 32 provided in the emitter region 12 is not connected with the gate trench portion 40. That is, in the emitter region 12, the semiconductor region remains between the branch portion 32 and the gate trench portion 40. The region functions as a channel region. The branch portion 32 provided in the emitter region 12 and the branch portion 32 provided in the contact region 15 may have the same length.

In this way, the IE effect can be heightened by forming the branch portion 32. Also, since the branch portion 32 and the gate trench portion 40 are separated apart from each other in the emitter region 12, the channel region can be ensured and the channel density can be kept.

Figure 5:
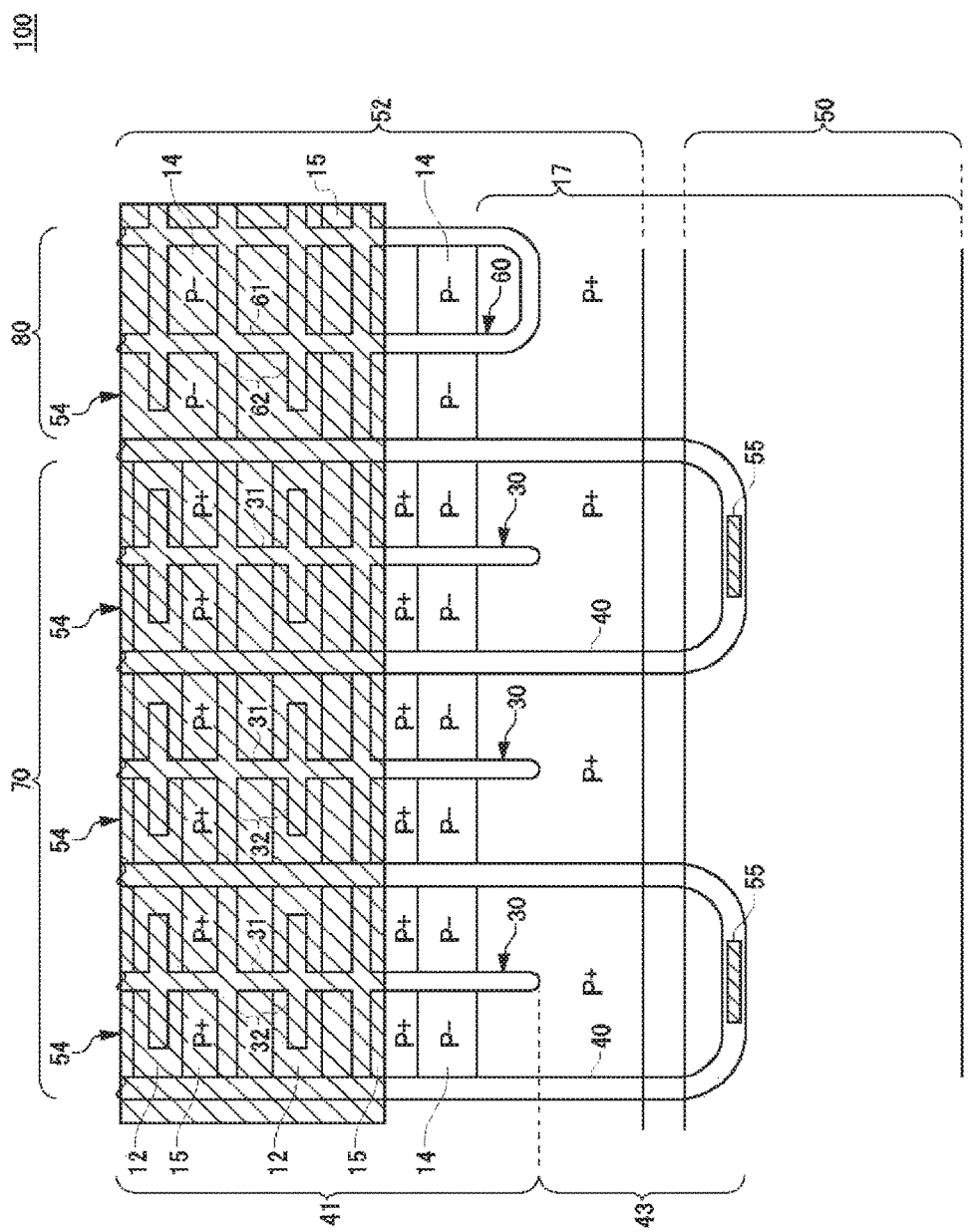
FIG. 5 is a plan view showing still another example of the semiconductor device 100.

FIG. 5 is a plan view showing another example of the semiconductor device 100. The semiconductor device 100 of the present example is different from the semiconductor device 100 shown in FIG. 1 to FIG. 4 in a point that the branch portion 32 provided in the contact region 15 in the front surface of the semiconductor substrate is connected with the gate trench portion 40. The other structures may be the same as those in the semiconductor device 100 shown in any one of FIG. 1 to FIG. 4. The branch portion 32 provided in the emitter region 12 is not connected with the gate trench portion 40.

By forming the branch portion 32 in this way, the IE effect can be heightened. Also, by connecting the branch portion 32 in the contact region 15 with the gate trench portion 40, the number of the corner portions can be increased, and the IE effect can be further heightened.

The branch portion 62 in the diode unit 80 may connect with or may not connect with the gate trench portion 40. Also, some of the branch portions 62 may connect with the gate trench portion 40. In the example of FIG. 5, the branch portion 62 provided on a straight line with the branch portion 32 provided in the contact region 15 is connected with the gate trench portion 40.

In a case where the branch portion 62 is connected with the gate trench portion 40, the gate trench portion 40 and the dummy trench portion 30 may be formed by different processes. For example, after forming the gate conductive portion 44 inside the gate trench portion 40, the dummy trench 38 connecting with the gate trench 46 may be formed. After forming the dummy trench 38, the dummy insulating portion 39 is formed. A process of forming the dummy insulating portion 39 may be the same as a process of forming the interlayer insulating film 26.

Figure 6:
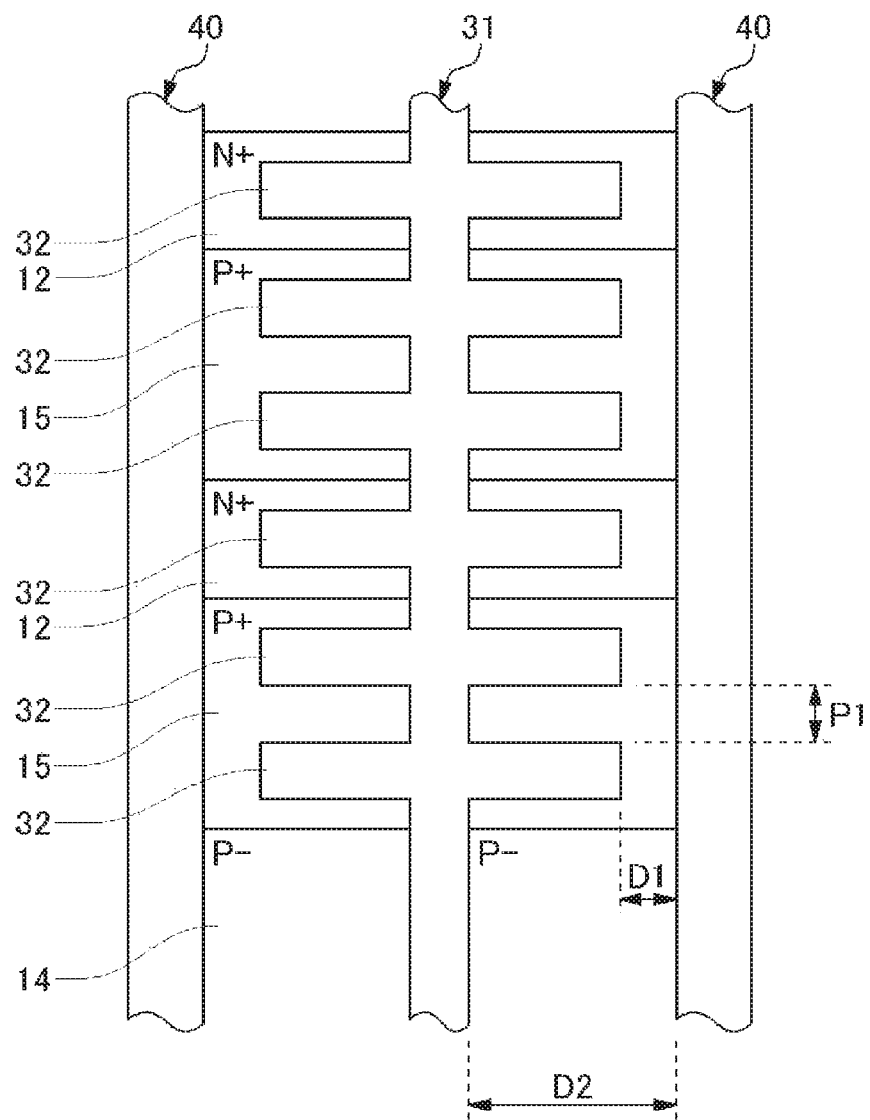
FIG. 6 is a plan view showing another example of a dummy trench portion 30.

FIG. 6 is a plan view showing another example of the dummy trench portion 30. The dummy trench portion 30 in the present example has a plurality of branch portions 32 inside one contact region 15 in the front surface of the semiconductor substrate. The dummy trench portion 30 in the present example may be applied to the semiconductor device 100 shown in any one of FIG. 1 to FIG. 5.

The number of the branch portions 32 provided in one contact region 15 may be greater than the number of the branch portions 32 provided in one emitter region 12. In one emitter region 12, one branch portion 32 may be provided, and in one contact region 15, a plurality of branch portions 32 may be provided.

Also, the width of the contact region 15 in the extending direction of the main body portion 31 may be greater than the width of the emitter region 12. Also, in the extending direction of the main body portion 31, the interval P1 between the respective branch portions 32 may be fixed. The branch portions 32 may not be formed in boundaries between the contact region 15 and the emitter region 12, and may also be formed on the boundaries between the contact region 15 and the emitter region 12.

Also, in each semiconductor device 100 shown in FIG. 1 to FIG. 6, the length of the branch portion 32 (D2−D1) may be equal to or longer than a half of the distance D2 between the main body portion 31 and the gate trench portion 40 (that is, the gate trench 46), and may also be equal to or longer than ¾ of the distance D2 between the main body portion 31 and the gate trench portion 40. The distance D1 between the branch portion 32 and the gate trench portion 40 may be fixed, or may be different for each branch portion 32. The distance between the branch portion 32 and the gate trench portion 40 provided in the emitter region 12 may be greater than the distance between the branch portions 32 and the gate trench portion 40 provided in the contact region 15.

Also, the interval P1 between the respective branch portions 32 may be shorter than the distance D2 between the main body portion 31 and the gate trench portion 40. The interval P1 may be equal to or shorter than the half of the distance D2. By forming the branch portion 32 in a high density, the IE effect may be further heightened.

Figure 7:
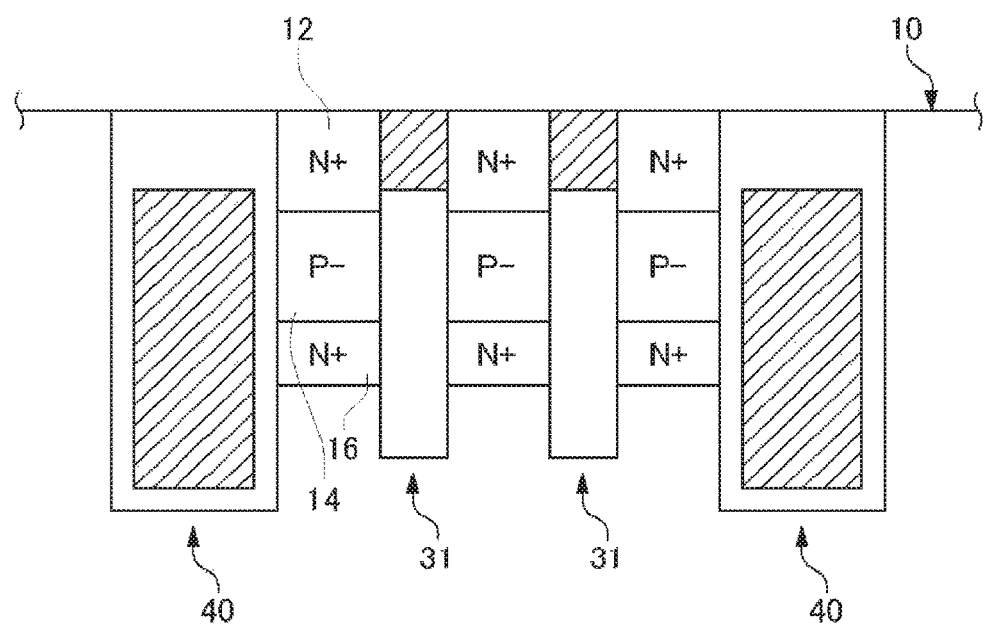
FIG. 7 is a drawing showing another example of the a-a' section of the semiconductor substrate 10.

FIG. 7 is a drawing showing another example of the a-a' section of the semiconductor substrate 10. FIG. 7 shows a vicinity of the front surface of the semiconductor substrate 10 and the other portions are omitted. The semiconductor device 100 in the present example comprises a plurality of main body portions 31 between two gate trench portions 40. The other structures may be the same as those of the semiconductor device 100 shown in any one of FIG. 1 to FIG. 6. According to such a configuration, the IE effect can be further heightened.

The plurality of main body portions 31 may be arrayed at the same interval. Also, the interval between the main body portion 31 and the gate trench portion 40 may be the same as and may be wider than the interval between the main body portions 31. By widening the interval between the main body portion 31 and the gate trench portion 40, the channel region can be left even if the manufacture irregularity and the like occur.

Figure 8:
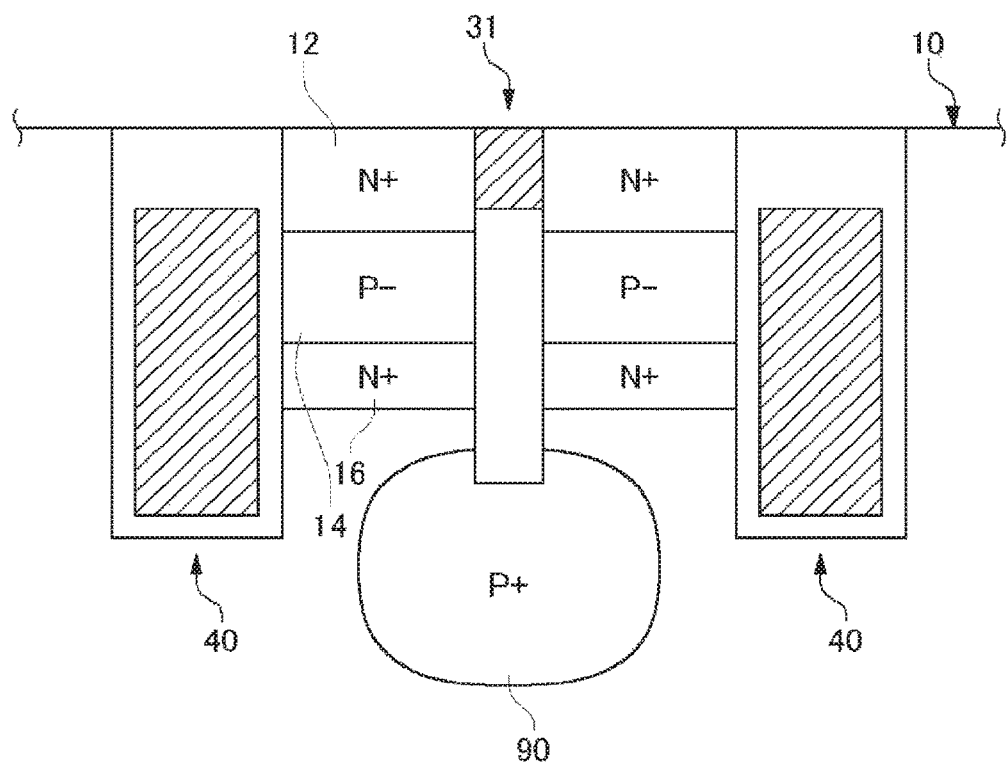
FIG. 8 is a drawing showing still another example of the a-a' section of the semiconductor substrate 10.

FIG. 8 is a drawing showing another example of the a-a' section of the semiconductor substrate 10. FIG. 8 shows a vicinity of the front surface of the semiconductor substrate 10 and the other portions are omitted. The semiconductor device 100 in the present example further comprises a $P^+$-type floating region 90 in a region adjacent to the bottom portion of the dummy trench portion 30 (the bottom portion of the dummy trench 38 in the main body portion 31 in FIG. 8), the $P^+$-type floating region 90 being separated from the base region 14. The other structures may be the same as those of the semiconductor device 100 shown in any one of FIG. 1 to FIG. 7.

The floating region 90 may be formed along the main body portion 31 and may not be formed in the branch portion 32. The width of the floating region 90 in the direction connecting two gate trench portions 40 may be greater than the width of the main body portion 31. The width of the floating region 90 may be equal to or longer than a half of the distance between two gate trench portions 40. The distance between the floating region 90 and the gate trench portion 40 may be greater than the distance between the branch portion 32 and the gate trench portion 40.

Also, the bottom portion of the floating region 90 may be provided in a position deeper than the bottom portion of the gate trench portion 40, viewed from the front surface side of the semiconductor substrate 10. The bottom portion of the main body portion 31 may be provided in a position shallower than the bottom portion of the gate trench portion 40. By providing the floating region 90, the IE effect can be further heightened.

Also, as shown in FIG. 7, in a case where a plurality of main body portions 31 are provided between two gate trench portions 40, the floating region 90 may be formed in the bottom portion of each main body portions 31. The floating regions 90 in the respective main body portions 31 may be separated from each other or may be connected with each other.

Figure 9:
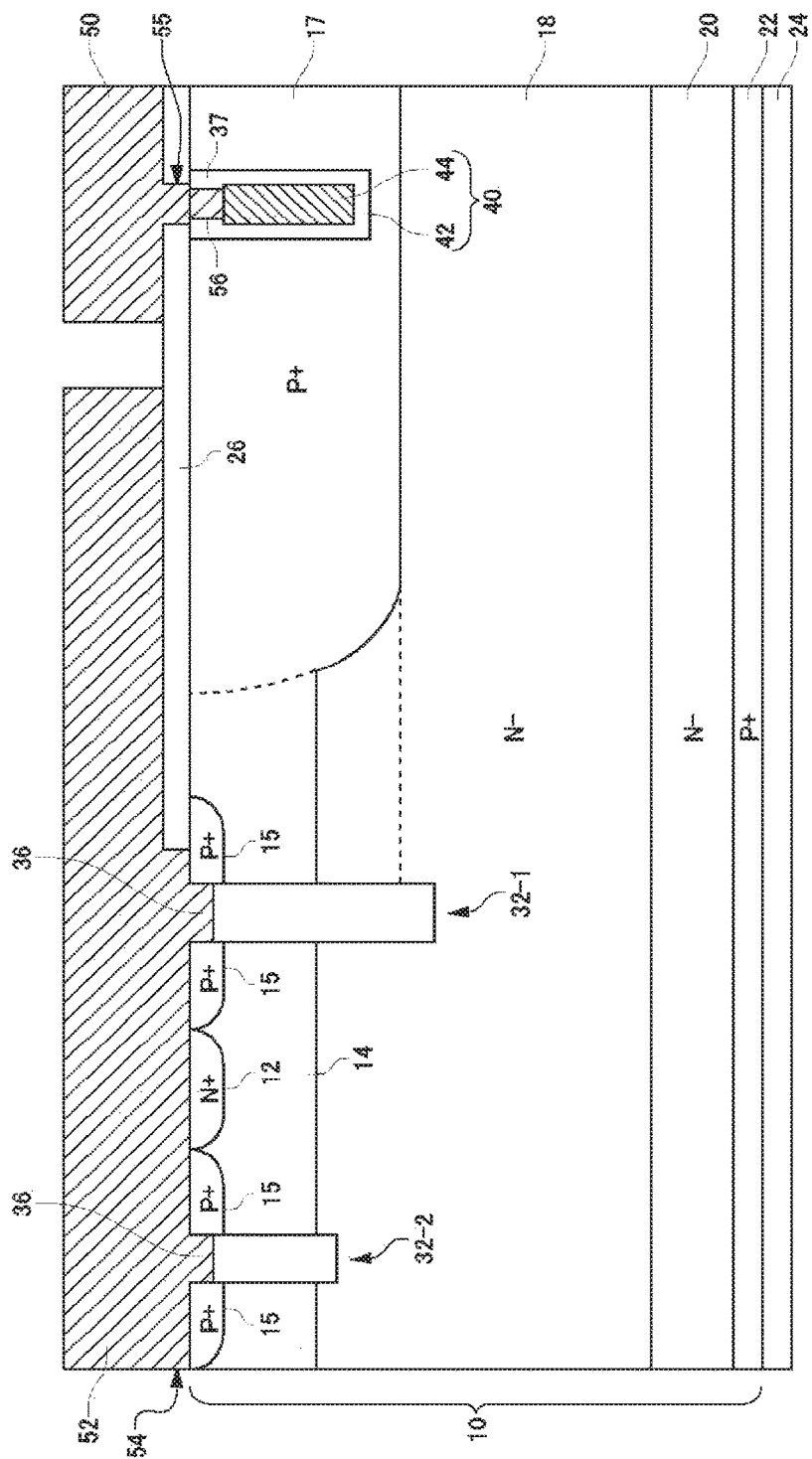
FIG. 9 is a drawing showing another example of the b-b' section of the semiconductor substrate 10.

FIG. 9 is a drawing showing another example of the b-b' section of the semiconductor substrate 10. The semiconductor device 100 in the present example comprises the branch portions 32 with different depths from each other. The other structures may be the same as those of the semiconductor device 100 shown in any one of FIG. 1 to FIG. 8.

A dummy trench of a branch portion 32-1 provided in a position closest to the well region 17 in the extending direction of the main body portion 31 may be formed reaching to a position deeper than a dummy trench of another branch portion 32-2. For example, the dummy trench of the branch portion 32-1 is formed reaching a position deeper than the bottom portion of the well region 17.

The width of the dummy trench of the branch portion 32-1 may be greater than the width of the dummy trench of the branch portion 32-2. Accordingly, the branch portions 32 with different depths can be formed by the same process. Also, the branch portion 32-1 may connect with the gate trench portion 40. Accordingly, the well region 17 can be separated from the emitter region 12 in the active region and the like by a deep dummy trench. It is preferable that the branch portion 32-1 is filled with insulating materials.

Figure 10:
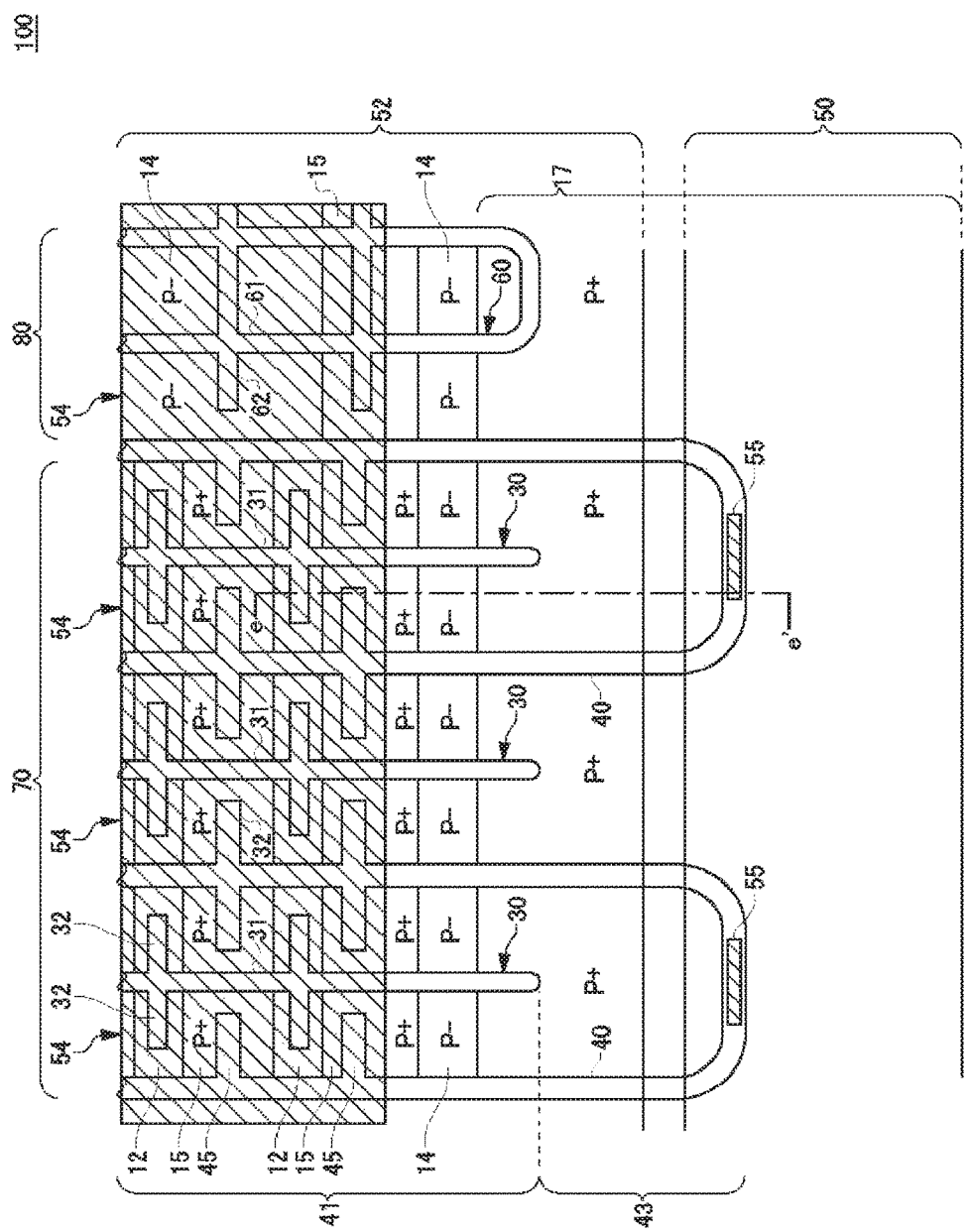
FIG. 10 is a plan view showing another example of the semiconductor device 100.

FIG. 10 is a plan view showing another example of the semiconductor device 100. The semiconductor device 100 in the present example is different from the examples in FIG. 1 to FIG. 9 in a point that the branch portion 45 is also provided in the gate trench portion 40 in the front surface of the semiconductor substrate. The other structures may be the same as those of the semiconductor device 100 shown in any one of FIG. 1 to FIG. 9.

The branch portion 45 in the present example has the same structure as that of another portion of the gate trench portion 40, and is formed at the same depth as the other portion of the gate trench portion 40. For example, the branch portion 45 has the gate trench 46, the insulation film 42, the gate conductive portion 44 and the gate insulating portion 37. The branch portion 45 is provided extending from a predetermined place of the gate trench portion 40 in a direction different from the extending direction of the dummy trench portion 30. As one example, the branch portion 45 is provided extending from the gate trench portion 40 in a direction vertical to the extending direction. Also, the branch portion 45 extends from the gate trench portion 40 in a direction toward the dummy trench portion 30. However, the branch portion 45 is formed in a range without being in contact with the dummy trench portion 30.

The branch portion 32 of the dummy trench portion 30 in the present example is formed within the emitter region 12 in the plan view. Also, the branch portion 45 of the gate trench portion 40 is formed within the contact region 15 in the plan view. The branch portion 32 and the branch portion 45 may be formed alternately in the extending direction of the main body portion 31 of the dummy trench portion 30. According to such a structure, the IE effect can be further heightened.

Figure 11:
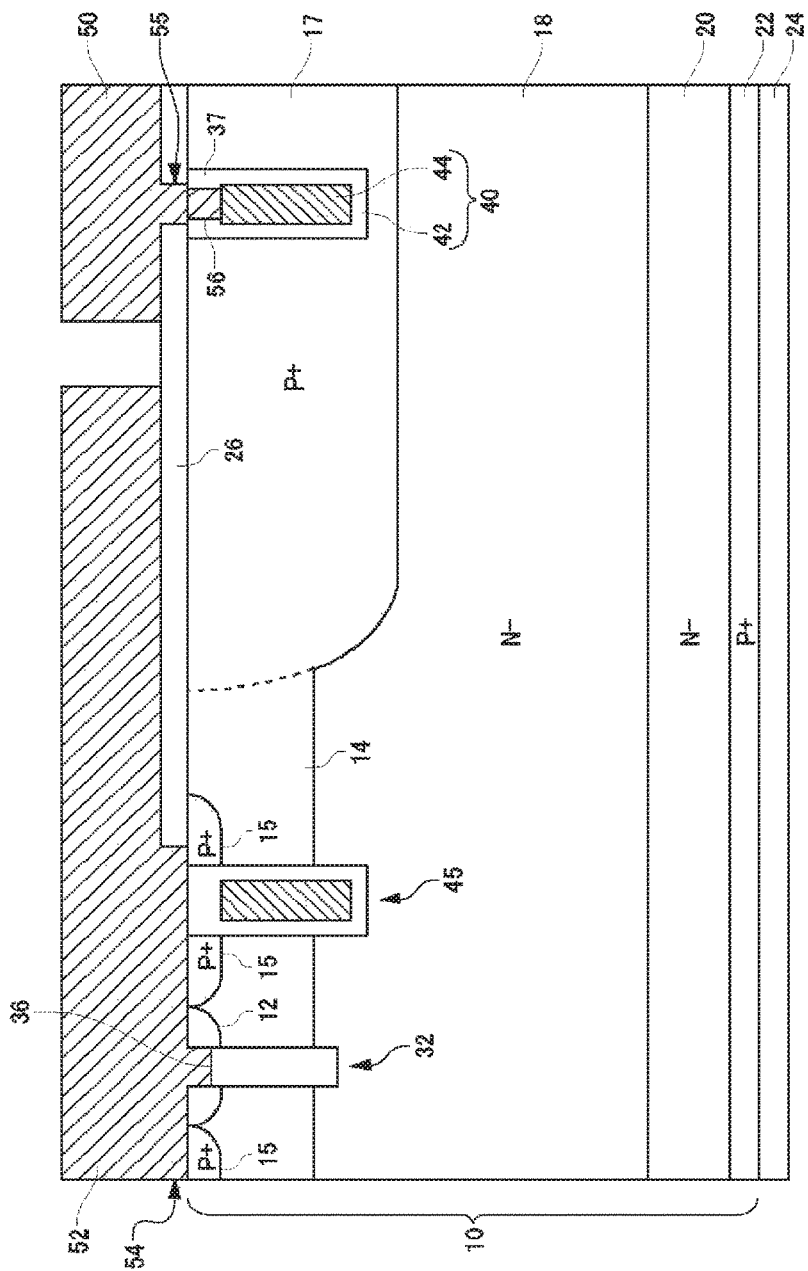
FIG. 11 is a drawing showing an e-e' section of the semiconductor device 100.

FIG. 11 is a drawing showing an e-e' section of the semiconductor device 100. In FIG. 11, the accumulation region 16 is omitted. The semiconductor device 100 in the present example is different from the example shown in FIG. 3 in a point that the branch portion 45 is further included and the position of the branch portion 32 is different. The other structures are the same as those of the example shown in FIG. 3. In FIG. 3, the accumulation region 16 is omitted.

The branch portion 45 of the gate trench portion 40 is formed to penetrate the contact region 15 from the front surface of the semiconductor substrate 10. The branch portion 45 further penetrates the base region 14. The branch portion 45 may further penetrate the accumulation region 16.

The branch portion 32 of the dummy trench portion 30 is formed to penetrate the emitter region 12 from the front surface of the semiconductor substrate 10. The branch portion 32 further penetrates the base region 14. The branch portion 32 may further penetrate the accumulation region 16. The branch portion 32 may be formed shallower than the branch portion 45. Also, the branch portion 32 and the branch portion 45 may be formed shallower than the well region 17.

Figure 12:
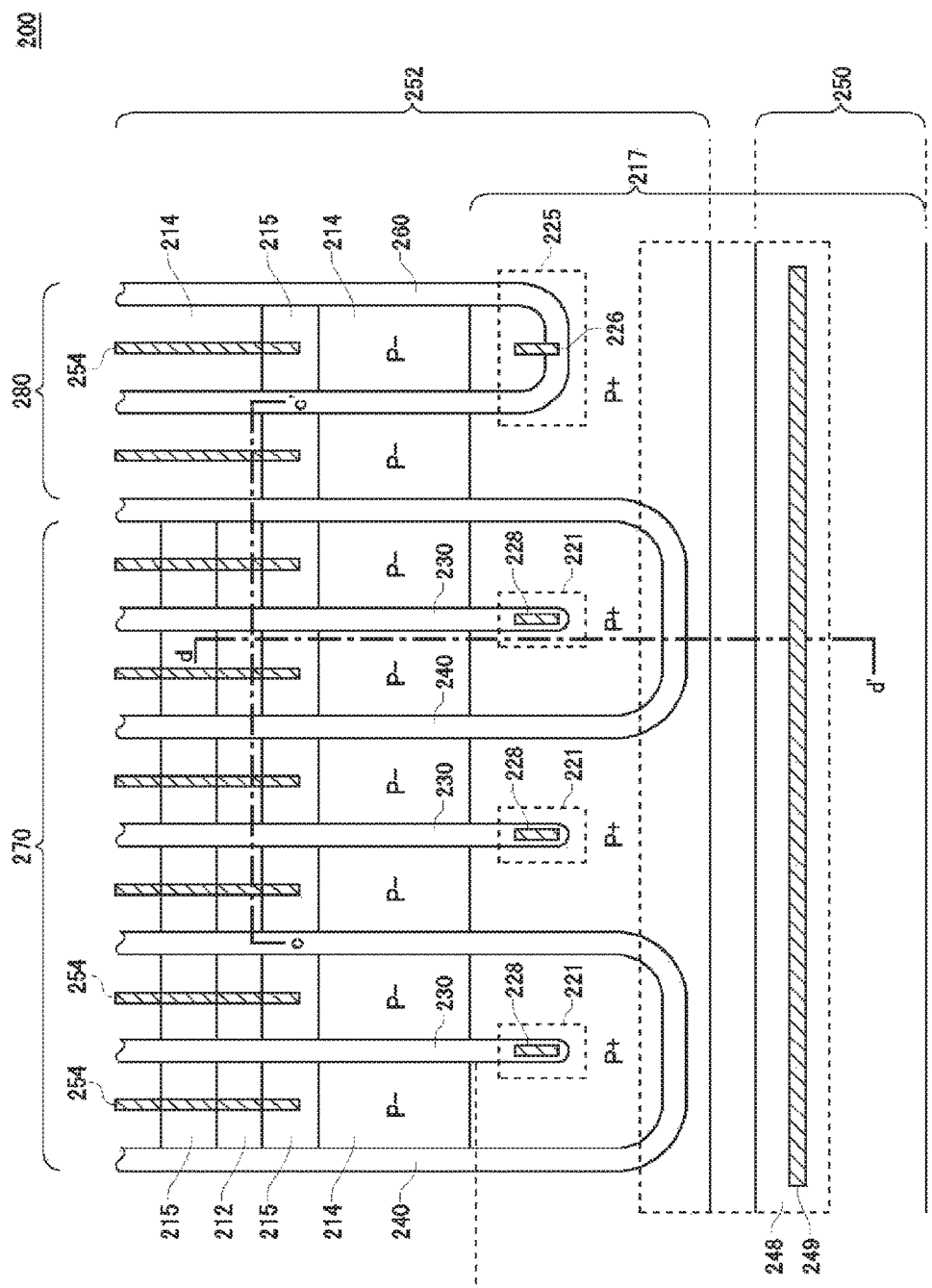
FIG. 12 is a drawing showing a configuration of a semiconductor device 200 according to a comparative example.

FIG. 12 is a drawing showing a configuration of a semiconductor device 200 according to a comparative example. The semiconductor device 200 comprises a transistor unit 270 and a diode unit 280. Also, the semiconductor device 200 comprises on its front surface side a gate electrode 250, an emitter electrode 252, a gate trench portion 240, a dummy trench portion 230, an emitter trench portion 260, a well region 217, an emitter region 212, a base region 214, a contact region 215, contact holes 226, 228, 249 and 254, and polysilicon layers 221, 225 and 248.

The dummy trench portion 230 is formed linearly and does not have any branch portion. For this reason, it is comparatively difficult to heighten the IE effect. On the other hand, the semiconductor device 100 can easily heighten the IE effect since its dummy trench portion 30 has the branch portions 32.

Figure 13:
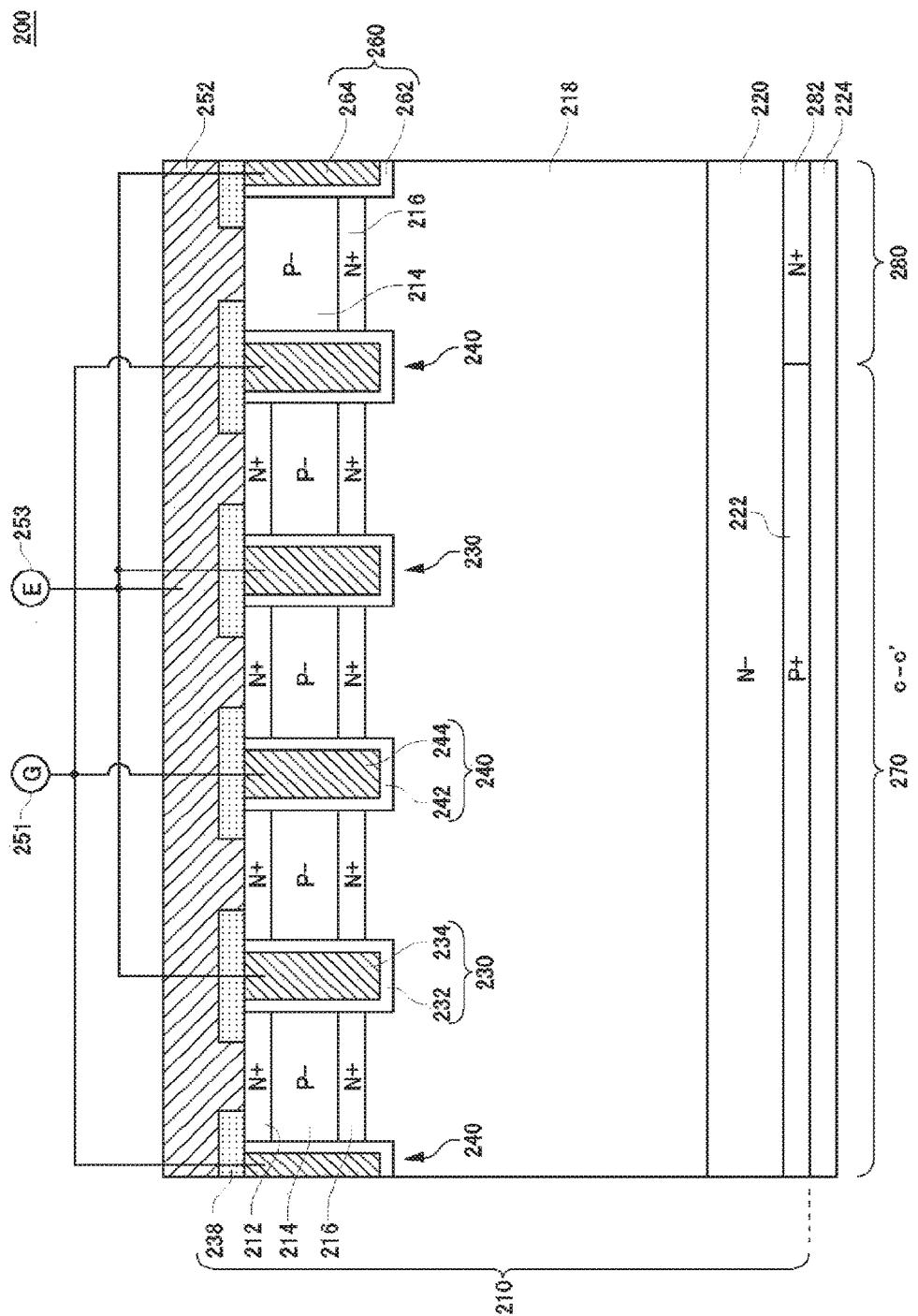
FIG. 13 shows a c-c' section in FIG. 12.

FIG. 13 shows a c-c' section in FIG. 12. The semiconductor device 200 comprises the semiconductor substrate 210, the emitter electrode 252, the insulating portion 238 and the collector electrode 224 in the section. Also, the gate terminal 251 is electrically connected with the gate conductive portion 244, and the emitter terminal 253 is electrically connected with the emitter electrode 252.

In the semiconductor substrate 10, the gate trench portion 240, the dummy trench portion 230, the emitter trench portion 260, the emitter region 212, the base region 214, the accumulation region 216, the drift region 218, the buffer region 220, the collector region 222 and the cathode region 282 are formed. The gate trench portion 240 has the insulation film 242 and the gate conductive portion 244. The dummy trench portion 230 has the insulation film 232 and the dummy conductive portion 234. The emitter trench portion 260 has the insulation film 262 and the emitter conductive portion 264.

In the semiconductor device 200, since the dummy conductive portion 234 is provided in the dummy trench portion 230, it is preferable to test the insulation reliability of the insulation film 232 such that the dummy conductive portion 234 is not electrically connected with the semiconductor region of the semiconductor substrate 10. On the other hand, according to the semiconductor device 100 shown in FIG. 2, since the dummy conductive portion is not provided in the dummy trench portion 30, it is not necessary to test the insulation reliability of the dummy insulating portion 39.

In the semiconductor device 200, the emitter region 212 is not exposed on the side wall of the trench of the dummy trench portion 230. For this reason, the emitter electrode 252 is in contact with the emitter region 212 only on the front surface of the semiconductor substrate 210. If the semiconductor device 200 is miniaturized, the area of the emitter region 212 exposed on the front surface of the semiconductor substrate 210 becomes small and the contact resistance between the emitter electrode 252 and the emitter region 212 increases.

Also, in the semiconductor device 200, the insulating portion 238 is formed on the front surface of the semiconductor substrate 210. In this case, to exactly insulate the gate conductive portion 244 from the emitter electrode 252, the insulating portion 238 is provided covering a range wider than the gate trench portion 240. That is, the insulating portion 238 covers a part of the front surface of the emitter region 212. For this reason, the area of the emitter region 212 exposed on the front surface of the semiconductor substrate 210 further becomes small. Therefore, in the semiconductor device 200, it is difficult to realize both the miniaturization of the semiconductor device and the low ON voltage at the same time.

On the other hand, according to the semiconductor device 100 shown in FIG. 2, the emitter electrode 52 can be in contact with the front surface and the side surface of the emitter region 12. For this reason, even if miniaturizing the semiconductor device 100, the contact resistance between the emitter electrode 52 and the emitter region 12 can be sufficiently lowered.

Also, according to the semiconductor device 100 shown in FIG. 2, since the gate insulating portion 37 is formed within the gate trench, the gate insulating portion 37 does not cover the front surface of the emitter region 12. Accordingly, the contact area between the emitter electrode 52 and the emitter region 12 can be increased.

Figure 14:
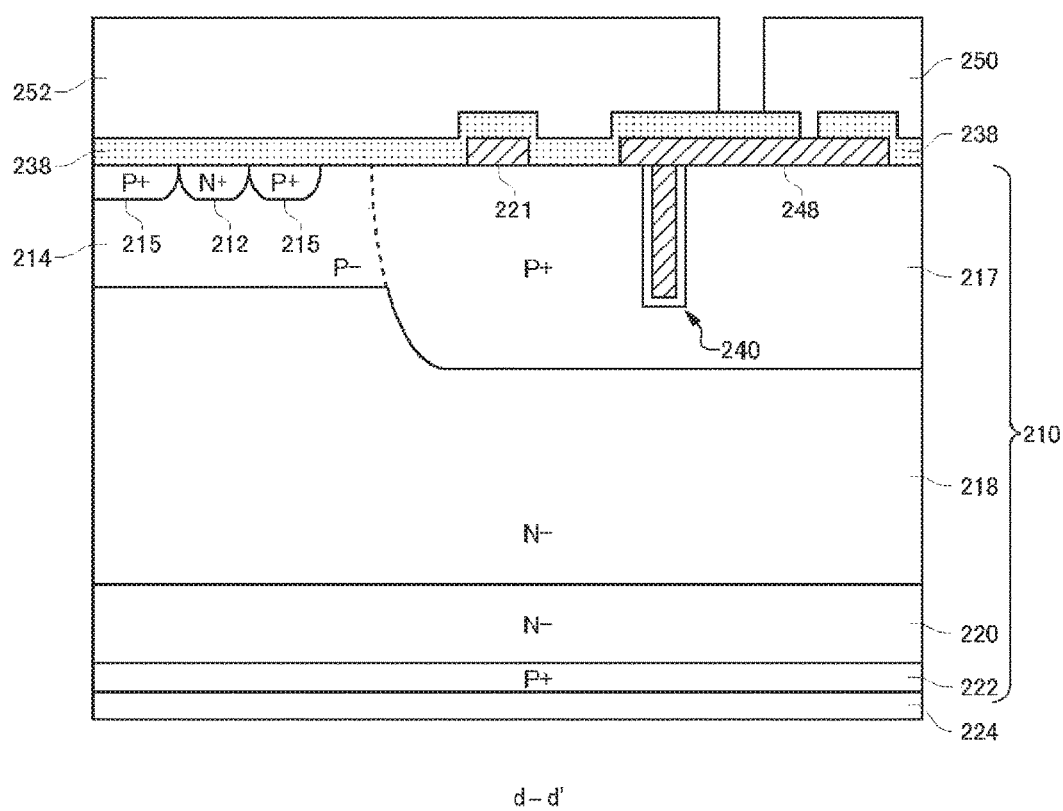
FIG. 14 shows a d-d' section in FIG. 12.

FIG. 14 shows a d-d' section in FIG. 12. The semiconductor device 200 comprises the semiconductor substrate 210, the emitter electrode 252, the gate electrode 250, the collector electrode 224, the polysilicon layer 221, the polysilicon layer 248 and the insulating portion 238 in the section.

The polysilicon layer 221 and the polysilicon layer 248 are formed on the front surface of the semiconductor substrate 210, and connect the conductive portion within each trench with the emitter electrode 252 or the gate electrode 250. The semiconductor device 200 selectively comprises the polysilicon layer 221 and the polysilicon layer 248 on the front surface of the semiconductor substrate 210. For this reason, the unevenness is generated on the front surface of the semiconductor substrate 210, and it becomes not easy to form a layer such as the insulating portion 238 formed above the front surface of the semiconductor substrate 210.

On the other hand, according to the semiconductor device 100 shown in FIG. 2 and FIG. 3, since the emitter electrode 252 and the gate electrode 250 are directly in contact with the conductive portion within each trench, the polysilicon layer does not have to be provided the front surface of the semiconductor substrate 10. For this reason, the unevenness on the front surface of the semiconductor substrate 10 can be reduced.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The terms "on" and "above" and the terms "below" and "under" described in the claims or the present specification indicate directions opposite to each other. It should be noted that the terms "on" and "above" are not limited to a direction reverse to the direction of the gravity. Also, the terms "below" and "under" is not limited to the direction of the gravity. For example, in a semiconductor device implemented in an electric apparatus, even if a gate electrode and the like are arranged on a front surface on the ground side of the semiconductor substrate, it is apparent that the semiconductor device can be included in the present invention.

EXPLANATION OF REFERENCES

10 . . . semiconductor substrate, 12 . . . emitter region, 14 . . . base region, 15 . . . contact region, 16 . . . accumulation region, 17 . . . well region, 18 . . . drift region, 20 . . . buffer region, 22 . . . collector region, 24 . . . collector electrode, 26 . . . interlayer insulating film, 30 . . . dummy trench portion, 31 . . . main body portion, 32 . . . branch portion, 36 . . . plug portion, 37 . . . gate insulating portion, 38 . . . dummy trench, 39 . . . dummy insulating portion, 40 . . . gate trench portion, 41 . . . facing portion, 42 . . . insulation film, 43 . . . protruding portion, 44 . . . gate conductive portion, 45 . . . branch portion, 46 . . . gate trench, 50 . . . gate electrode, 51 . . . gate terminal, 52 . . . emitter electrode, 53 . . . emitter terminal, 54 . . . contact hole, 55 . . . contact hole, 56 . . . plug portion, 60 . . . emitter trench portion, 61 . . . main body portion, 62 . . . branch portion, 68 . . . emitter trench, 69 . . . emitter insulating portion, 70 . . . transistor unit, 80 . . . diode unit, 82 . . . cathode region, 90 . . . floating region, 100 . . . semiconductor device, 200 . . . semiconductor device, 210 . . . semiconductor substrate, 212 . . . emitter region, 214 . . . base region, 215 . . . contact region, 216 . . . accumulation region, 217 . . . well region, 218 . . . drift region, 220 . . . buffer region, 221 . . . polysilicon layer, 222 . . . collector region, 224 . . . collector electrode, 225 . . . polysilicon layer, 226 . . . contact hole, 228 . . . contact hole, 230 . . . dummy trench portion, 232 . . . insulation film, 234 . . . dummy conductive portion, 238 . . . insulating portion, 240 . . . gate trench portion, 242 . . . insulation film, 244 . . . gate conductive portion, 248 . . . polysilicon layer, 249 . . . contact hole, 250 . . . gate electrode, 251 . . . gate terminal, 252 . . . emitter electrode, 253 . . . emitter terminal, 254 . . . contact hole, 260 . . . emitter trench portion, 262 . . . insulation film, 264 . . . emitter conductive portion, 270 . . . transistor unit, 280 . . . diode unit, 282 . . . cathode region

What is claimed is:

1. A semiconductor device comprising:
   a semiconductor substrate of a first conductivity type; and
   a dummy trench portion having a main body portion and a plurality of branch portions provided on both sides of the main body portion, the main body portion formed in a front surface of the semiconductor substrate and extending in a predetermined extending direction, the plurality of branch portions extending from the main body portion in directions different from the extending direction, the main body portion and the plurality of branch portions together forming a non-linear shape across the front surface of the semiconductor substrate, wherein
   the semiconductor substrate has an emitter region of a first conductivity type and a base region of a second conductivity type which are provided sequentially from the front surface side of the semiconductor substrate,
   the dummy trench portion has a dummy trench which penetrates the emitter region and the base region from the front surface of the semiconductor substrate, and a dummy insulating portion which is provided within the dummy trench, the semiconductor substrate further has a contact region of a second conductivity type which is connected with the base region, and which has an impurity concentration higher than that of the base region and is exposed in the front surface of the semiconductor substrate, and the branch portions are a non-active dummy trench, a first front surface side emitter electrode directly contacts the emitter region and the contact region in an inner side wall of the dummy trench of the plurality of branch portions, and at least some of the plurality of branch portions are provided inside the contact region in the front surface of the semiconductor substrate.

2. The semiconductor device according to claim 1, wherein the dummy insulating portion is filled from a bottom portion of the dummy trench to a predetermined height within the dummy trench.

3. The semiconductor device according to claim 2, wherein the branch portions extend in directions orthogonal to the extending direction of the main body portion.

4. The semiconductor device according to claim 2, further comprising:

a gate trench portion formed in the front surface of the semiconductor substrate, wherein the gate trench portion has a gate trench which penetrates the emitter region and the base region of the semiconductor substrate, and a gate conductive portion which is provided inside the gate trench, the main body portion of the dummy trench portion is provided to face the gate trench, the branch portions of the dummy trench portion are provided to extend toward the gate trench, and at least some of the branch portions of the dummy trench portion are not in contact with the gate trench.

5. The semiconductor device according to claim 4, wherein the semiconductor substrate further has a contact region of a second conductivity type which is connected with the base region, has an impurity concentration higher than that of the base region and is exposed in the front surface of the semiconductor substrate, and at least some of the branch portions are provided inside the contact region in the front surface of the semiconductor substrate.

6. The semiconductor device according to claim 4, wherein the extension of the branch portions from the main body portion is equal to or longer than a half of a distance between the main body portion of the dummy trench portion and the gate trench.

7. The semiconductor device according to claim 4, wherein each interval between the branch portions in the extending direction of the main body portion is shorter than a distance between the main body portion and the gate trench.

8. The semiconductor device according to claim 4, wherein the dummy trench is formed reaching to a position shallower than the gate trench.

9. The semiconductor device according to claim 8, wherein a width of the dummy trench in the main body portion is shorter than a width of the gate trench.

10. The semiconductor device according to claim 4, wherein the semiconductor substrate further has an accumulation region of a first conductivity type which is provided in a back surface side of the base region and has an impurity concentration higher than that of the semiconductor substrate, and the dummy trench further penetrates the accumulation region.

11. The semiconductor device according to claim 4, wherein the semiconductor substrate further has a floating region of a second conductivity type separated from the base region in a region adjacent to the bottom portion of the dummy trench.

12. The semiconductor device according to claim 11, wherein a bottom portion of the floating region is provided in a position deeper than a bottom portion of the gate trench.

13. The semiconductor device according to claim 4, wherein the semiconductor substrate further has a well region of a second conductivity type which is provided outside the emitter region in the front surface of the semiconductor substrate and has an impurity concentration higher than that of the base region, and the dummy trench of the branch portion provided in a position closest to the well region in the extending direction is formed reaching to a position deeper than the dummy trench of the other branch portion.

14. The semiconductor device according to claim 13, wherein a distance across the dummy trench of the branch portion closest to the well region is greater than a distance across the dummy trench of another branch portion.

15. The semiconductor device according to claim 4, further comprising:

a first front surface side electrode which is provided above the front surface of the semiconductor substrate and is in contact with a front surface of the emitter region, wherein the dummy insulating portion is filled within the dummy trench such that at least a part of the emitter region is exposed on a side wall of the dummy trench, and the first front surface side electrode is also in contact with the emitter region in the side wall of the dummy trench.

16. The semiconductor device according to claim 15, wherein the gate trench portion further has a gate insulating portion which is provided above the gate conductive portion inside the gate trench and insulates the first front surface side electrode from the gate conductive portion.

17. The semiconductor device according to claim 4, wherein the gate trench portion includes one or more branch portions extending in directions different from the extending direction.

18. The semiconductor device according to claim 1, wherein the dummy trench portion is embedded with only an oxide film from a bottom portion through to the first front surface side emitter electrode.

19. A semiconductor device comprising:

a semiconductor substrate of a first conductivity type; and a non-active dummy trench portion having a main body portion and one or more branch portions, the main body portion formed in a front surface of the semiconductor substrate and extending in a predetermined extending direction, the one or more branch portions extending at least to a point equal to a width of the main body portion distant from the main body portion and less than a distance to a gate trench portion, from the main body portion in directions different from the extending direction, the main body portion and the one or more branch portions together forming a non-linear shape across the front surface of the semiconductor substrate, wherein the semiconductor substrate has an emitter region of a first conductivity type and a base region of a second conductivity type which are provided sequentially from the front surface side of the semiconductor substrate, and the non-active dummy trench portion has a dummy trench which penetrates the emitter region and the base region from the front surface of the semiconductor substrate, and a dummy insulating portion which is provided within the dummy trench.

\* \* \* \* \*